United States Patent
Ueda et al.

(10) Patent No.: US 10,141,185 B2
(45) Date of Patent: Nov. 27, 2018

(54) OXIDE SEMICONDUCTOR, COATING LIQUID, METHOD OF FORMING OXIDE SEMICONDUCTOR FILM, SEMICONDUCTOR ELEMENT, DISPLAY ELEMENT, IMAGE DISPLAY DEVICE AND IMAGE DISPLAY SYSTEM

(71) Applicants: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

(21) Appl. No.: 15/401,157

(22) Filed: Jan. 9, 2017

(65) Prior Publication Data

US 2017/0200606 A1    Jul. 13, 2017

(30) Foreign Application Priority Data

Jan. 12, 2016  (JP) ................................. 2016-003739

(51) Int. Cl.
*G09G 5/00* (2006.01)
*H01L 21/02* (2006.01)
(Continued)

(52) U.S. Cl.
CPC .. *H01L 21/02565* (2013.01); *H01L 21/02422* (2013.01); *H01L 21/02554* (2013.01);
(Continued)

(58) Field of Classification Search
USPC .... 345/690, 205, 207, 92, 102, 100; 257/40, 257/43; 252/500; 526/256; 348/252
See application file for complete search history.

(56) References Cited

U.S. PATENT DOCUMENTS 6,294,274 B1  9/2001  Kawazoe et al.
7,026,713 B2  4/2006  Hoffman et al.
(Continued)

FOREIGN PATENT DOCUMENTS

JP  H11-278834  10/1999
JP  2000-150861  5/2000
(Continued)

OTHER PUBLICATIONS

Hiroshi Kawazoe et al, "P-type electrical conduction in transparent thin films of CuAlO2", Materials and Structures Laboratory, Tokyo Institute of Technology, Nature, Macmillan Publishers Ltd., vol. 389, pp. 939-942, Oct. 30, 1997.
(Continued)

*Primary Examiner* — Thuy Pardo
(74) *Attorney, Agent, or Firm* — Cooper & Dunham LLP

(57) ABSTRACT

An oxide semiconductor includes an oxide having a layered structure expressed by an expression of a product of $[(AO)(ZO)_{m_i}(BO)(ZO)_{n_i}]_i$ from i=1 to L. In the product, an atom A is a positive monovalent element, an atom Z is a positive divalent element, an atom B is a positive trivalent element, L is a positive integer, and $m_i$ and $n_i$ are independent integers greater than or equal to zero. A sum from i=1 to L of $(m_i+n_i)$ is not zero.

15 Claims, 11 Drawing Sheets

(51) Int. Cl.
  *H01L 29/24*  (2006.01)
  *H01L 29/786*  (2006.01)
  *H01L 27/12*  (2006.01)
  *H01L 29/66*  (2006.01)
  *H01L 29/861*  (2006.01)
  *H01L 27/32*  (2006.01)

(52) U.S. Cl.
  CPC .. *H01L 21/02576* (2013.01); *H01L 21/02579* (2013.01); *H01L 21/02628* (2013.01); *H01L 27/1225* (2013.01); *H01L 29/24* (2013.01); *H01L 29/66969* (2013.01); *H01L 29/7869* (2013.01); *H01L 29/861* (2013.01); *H01L 27/3262* (2013.01); *H01L 2251/533* (2013.01)

(56) References Cited

U.S. PATENT DOCUMENTS

| | | | | |
|---|---|---|---|---|
| 8,902,145 | B2* | 12/2014 | Umezaki | G09G 3/3677 345/92 |
| 9,112,039 | B2 | 8/2015 | Ueda et al. | |
| 9,443,987 | B2* | 9/2016 | Miyanaga | H01L 29/7869 |
| 9,647,128 | B2* | 5/2017 | Yamazaki | H01L 29/7869 |
| 2010/0259653 | A1* | 10/2010 | Kimura | G09G 3/3406 348/252 |
| 2011/0128275 | A1 | 6/2011 | Ueda et al. | |
| 2012/0056860 | A1* | 3/2012 | Umezaki | G09G 3/3677 345/205 |
| 2012/0056861 | A1* | 3/2012 | Kurokawa | G09G 3/3648 345/207 |
| 2012/0248435 | A1* | 10/2012 | Koyama | H01L 27/1225 257/43 |
| 2013/0070000 | A1* | 3/2013 | Yoshida | G09G 3/2025 345/690 |
| 2013/0207091 | A1* | 8/2013 | Wierzchowiec | H01L 51/107 257/40 |
| 2014/0009514 | A1 | 1/2014 | Abe et al. | |
| 2014/0353648 | A1 | 12/2014 | Abe et al. | |
| 2014/0367617 | A1* | 12/2014 | Yoshida | C08G 61/12 252/500 |
| 2015/0130857 | A1* | 5/2015 | Yoshida | G09G 3/3406 345/690 |
| 2015/0349138 | A1 | 12/2015 | Sone et al. | |
| 2016/0013215 | A1 | 1/2016 | Ueda et al. | |
| 2016/0035987 | A1* | 2/2016 | Newsome | H01L 51/0003 252/500 |
| 2016/0042947 | A1 | 2/2016 | Nakamura et al. | |
| 2016/0075808 | A1* | 3/2016 | Mishra | C08G 61/126 526/256 |
| 2016/0078822 | A1* | 3/2016 | Yoshida | G09G 3/2025 345/690 |
| 2016/0079551 | A1* | 3/2016 | Wierzchowiec | H01L 51/107 257/40 |
| 2016/0190329 | A1 | 6/2016 | Matsumoto et al. | |
| 2016/0267873 | A1 | 9/2016 | Saotome et al. | |

FOREIGN PATENT DOCUMENTS

| | | |
|---|---|---|
| JP | 2005-183984 | 7/2005 |
| JP | 2010-074148 | 4/2010 |
| JP | 2012-216780 | 11/2012 |
| JP | 2013-138165 | 7/2013 |

OTHER PUBLICATIONS

Hiroshi Yanagi et al., "Bipolarity in electrical conduction of transparent oxide semiconductor $CuInO_2$ with delafossite structure", Materials and Structures Laboratory, Tokyo Institute of Technology, American Institute of Physics, vol. 78, No. 11, pp. 1583-1585, Mar. 12, 2001.

* cited by examiner

OXIDE SEMICONDUCTOR, COATING LIQUID, METHOD OF FORMING OXIDE SEMICONDUCTOR FILM, SEMICONDUCTOR ELEMENT, DISPLAY ELEMENT, IMAGE DISPLAY DEVICE AND IMAGE DISPLAY SYSTEM

CROSS-REFERENCE TO RELATED APPLICATIONS

The present application claims benefit of priority under 35 U.S.C. § 119 of Japanese Patent Application No. 2016-003739, filed Jan. 12, 2016. The contents of this application are incorporated herein by reference in their entirety.

BACKGROUND OF THE INVENTION

1. Field of the Invention

The disclosures herein generally relate to an oxide semiconductor, coating liquid, a method of forming an oxide semiconductor film, a semiconductor element, a display element, an image display device, and an image display system.

2. Description of the Related Art

Energetic promotion of research and development toward practical use of oxide semiconductors in the world has been triggered by the publication of information about an InGaZnO$_4$ (a-IGZO) thin film transistor (TFT) exhibiting mobility that is greater than or equal to that of a-Si in an amorphous state.

However, most of the oxide semiconductors are n-type oxide semiconductors in which carriers are electrons.

When p-type oxide semiconductors comparable to n-type oxide semiconductors become available, by combining the p-type oxide semiconductors with the n-type oxide semiconductors to form p-n junctions, diodes, optical sensors, photovoltaic cells, LEDs, bipolar transistors and the like are enabled. Furthermore, CMOS circuits in which n-type TFT and p-type TFT are combined can be fabricated. Because oxide semiconductors can be made with wide gaps, the above-described devices can be made transparent. Moreover, oxide semiconductors can be applied to active-matrix displays.

The p-type oxide semiconductors are known to include, for example, Cu$_2$O, CuAlO$_2$, CuInO$_2$, SrCu$_2$O$_2$, and SnO (see, for example, Japanese Unexamined Patent Application Publications No. H11-278834, No. 2000-150861, and No. 2005-183984, and Nature, Vol. 389, pp. 939-942 (1997)).

Moreover, the bipolar oxide semiconductors are known to include, for example, CuInO$_2$ (see, for example, Applied Physics Letters, Vol. 78, pp. 1583-1585 (2001)).

SUMMARY OF THE INVENTION

It is a general object of at least one embodiment of the present invention to provide an oxide semiconductor, coating liquid, a formation method of an oxide semiconductor film, a semiconductor element, a display element, an image display device, and an image display system, that substantially obviate one or more problems caused by the limitations and disadvantages of the related art.

In one embodiment, an oxide semiconductor includes an oxide having a layered structure expressed by an expression $$\prod_{i=1}^{L} [(AO)(ZO)_{m_i}(BO)(ZO)_{n_i}]_i. \qquad [1]$$

In the expression, an atom A is a positive monovalent element, an atom Z is a positive divalent element, an atom B is a positive trivalent element, L is a positive integer, and $m_i$ and $n_i$ are independent integers greater than or equal to zero. The integers $m_i$ and $n_i$ satisfy the following relation $$\sum_{i}^{L} (m_i + n_i) \neq 0.$$

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

<Oxide Semiconductor>

An oxide semiconductor according to an embodiment includes an oxide having a layered structure expressed by an expression $$\prod_{i=1}^{L} [(AO)(ZO)_{m_i}(BO)(ZO)_{n_i}]_i. \qquad [1]$$

In the expression, A, Z, and B are a positive monovalent element, a positive divalent element, and a positive trivalent element, respectively, L is a positive integer, $m_i$ and $n_i$ are independent integers greater than or equal to zero. The integers $m_i$ and $n_i$ satisfy the following relation $$\sum_{i}^{L}(m_i + n_i) \neq 0.$$

The oxide semiconductor has bipolarity, and conductivity (p-type or n-type) can be controlled by controlling a composition and by a proper carrier induction method. By changing values of L, $m_i$, $n_i$, the composition can be adjusted and the characteristic can be controlled widely.

Conventionally, a delafossite type oxide expressed by $ABO_2$ (e.g. A=Cu, Ag, B=Al, Ga, In) has been known. The delafossite type oxide has a layered structure in which a $(BO_2)^-$ layer, formed from edge-shared $BO_6$ octahedra, and an $A^+$ layer are alternatively laminated. Here, $A^+$ has a dumbbell structure of $AO_2$. Therefore, when holes are induced as carriers, p-type conductivity is exhibited. Furthermore, when B is $In^{3+}$, by inducing electron carriers, n-type conductivity is exhibited. However, because a molar ratio of A to B is 1 and a degree of freedom of doping is low, the conductivity is difficult to be controlled freely.

In the delafossite type oxide, all two-dimensional surfaces form a triangular lattice composed of a single element. The inventors of the present invention focused on this feature, and, as a result of earnest research, have invented the present invention. That is, the delafossite type oxide is expanded by inserting a layer of $Z^{2+}$ into the two-dimensional triangular lattices of $A^+$, $B^{3+}$, $O^{2-}$ forming the delafossite type oxide, so that the bipolar oxide semiconductor having the layered structure expressed by the expression [1] is obtained.

Here, $A^+$ has an $AO_2$ dumbbell structure, $B^{3+}$ has a $BO_6$ octahedral structure, and $Z^{2+}$ has a $ZO_4$ tetrahedral structure.

The atom A preferably includes any of Cu, Ag, Au, Pt, and Pd.

At this time, $AO_2$ layer performs the hole conduction.

The atom Z preferably includes any of Be, Mg, Ca, Sr, Ba, Zn, and Cd.

When Z is Zn or Cd, ZO layer performs the electron conduction.

When Z is Mg, Ca, Sr, or Ba, the ZO layer including the upper and lower oxygen layers of the Z layer are insulative and form a blocking layer.

The atom B preferably includes any of Al, Ga, In, Tl, Sc, Y, Ln (lanthanide), Cr, Mn, Fe, Co, Ni, and Rh.

When B is Ga, In or Tl, the $BO_2$ layer performs the electron conduction.

When B is Sc, Y, La, or Lu, the $BO_2$ layer is insulative and forms a blocking layer.

When B is Cr, Mn, Fe, Co, Ni, Rh, Ce, Pr, Nd, Sm, Eu, Gd, Tb, Dy, Ho, Er, Tm, or Yb, the $BO_2$ layer is a magnetic semiconductor.

Figure 1:
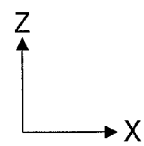
FIG. 1 is a diagram schematically depicting a layered structure expressed by the expression [1] (L=1, $m_1=n_1=1$)

FIG. 1 depicts a layered structure expressed by the expression [1] (L=1, $m_1=n_1=1$).

In FIG. 1, values of x are shown by steps of ⅓ from −1 to 1. A coordinate of each atom is y=⅔ when x=⅓, and y=⅓ when x=⅔. In this layered structure, by increasing values of m and n, a value of Z/A can be increased. Then, when Z includes Zn or Cd, n-type conduction can be easily obtained.

Figure 2:
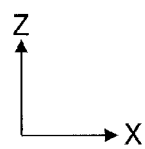
FIG. 2 is a diagram schematically depicting a layered structure expressed by the expression [1] (L=2, $m_1=m_2=n_1=0$, $n_2=2$)

FIG. 2 depicts a layered structure expressed by the expression [1] (L=2, $m_1=m_2=n_1=0$, $n_2=2$).

Similar to FIG. 1, in FIG. 2, values of x are shown by steps of ⅓ from −1 to 1. A coordinate of each atom is y=⅔ when x=⅓, and y=⅓ when x=⅔. In this layered structure, by selecting the blocking atoms for B and Z, p-type conduction can be easily obtained. Alternatively, when Z includes Zn or Cd, B includes In or Tl, and the values of m and n are increased, n-type conduction can be easily obtained.

<Substitutional Doping>

When appropriate elements are selected for A, B and Z, substitutional doping is enabled in any case of p-type and n-type, and controlling of conductivity becomes easier. Example of this process will be described as follows:

In a case where B is La, when a part of B is substituted for by Sr, the hole doping is enabled.

In a case where Z is Mg, when a part of Z is substituted for by Li, the hole doping is enabled.

In a case where B is In, when a part of B is substituted for by Sn, the electron doping is enabled.

In a case where Z is Zn, when a part of Z is substituted for by Ga, the electron doping is enabled.

A shape of the oxide semiconductor is not particularly restricted, and can be properly selected according to the purpose. For example, the shape includes a film or a bulk (particulate shape).

The oxide semiconductor is useful as an active layer of a semiconductor element, such as a p-n junction diode, a PIN photo diode, or a field-effect transistor.

An oxide semiconductor film can be formed by a formation method for oxide semiconductor film using a coating liquid, which will be described later.

The formation method for oxide semiconductor film other than the above-described method is not particularly restricted, but may be properly selected according to the purpose. The formation method includes, for example, a sputtering method, a pulse laser deposition (PLD) method, an MBE method, a CVD method, or an ALD method.

<Coating Liquid>

The coating liquid according to the embodiment includes an organic solvent, a compound including A or the same element as A with different valence from A (in the following, referred to as A-containing compound), a compound including B or the same element as B with different valence from B (in the following, referred to as B-containing compound), and a compound including Z or the same element as Z with different valence from Z (in the following, referred to as Z-containing compound). The coating liquid further includes other ingredient as necessary.

The coating liquid is used in a method of forming an oxide semiconductor film, which will be described later.

<<Organic Solvent>>

The organic solvent preferably includes at least any of organic acid, organic acid ester, aromatic series, diol, glycol ether, and an aprotic polarity solvent.

The organic solvent is appropriately selected depending on the intended purpose without any limitation. The organic solvent includes, for example, toluene, xylene, 2-ethylhexane acid, acetylacetone, ethyleneglycol, 2-methoxyethanol, isopropyl alcohol, or tetrahydrofuran.

Moreover, in order to add a desired physical property (e.g. viscoelasticity, dielectric constant) to the coating liquid, an organic solvent such as diethylene glycol or dimethyl formamide may be used.

The above-described solvent may include one kind or two or more kinds.

A contained amount of the organic solvent in the coating liquid is appropriately selected depending on the intended purpose without any limitation.

<<A-containing Compound, B-containing Compound and Z-containing Compound>>

Each of the A-containing compound, the B-containing compound and the Z-containing compound is preferably and independently at least any of an inorganic salt, an oxide, a hydroxide, an organic acid salt, a metal alkoxide, an organometallic compound, and a metal complex.

The valence of the element A in the oxide semiconductor is monovalent, but the valence of the A in the A-containing compound is not limited to monovalent.

For example, when A is Cu (I), a Cu-containing compound can be properly selected according to the purpose. For example, the Cu-containing compound includes an organic copper carboxylate such as copper neodecanoate (II); an organocopper complex such as copper phthalocyanine (II), or copper phenylacetylide (I); a copper alkoxide such as copper diethoxide (II); or an inorganic copper salt such as copper nitrate (II), or copper acetate (I). Among the above-described compounds, when manufacturing coating liquid using a non-polar organic solvent, from a viewpoint of solubility, the organic copper carboxylate is preferable, and copper neodecanoate (II) is more preferable. Moreover, when manufacturing coating liquid using a polar organic solvent, from a viewpoint of solubility, the inorganic copper salt is preferable, and copper nitrate (II) is more preferable.

A contained amount of the A-containing compound in the coating liquid is appropriately selected depending on the intended purpose without any limitation.

The valence of the element B in the oxide semiconductor is trivalent, but the valence of the B in the B-containing compound is not limited to trivalent.

For example, when B is Tl (III), a Tl-containing compound can be properly selected according to the purpose. For example, the Tl-containing compound includes an organic thallium carboxylate such as thallium 2-ethylhexanoate (I); an organothallium complex such as thallium acetylacetonate (I); a thallium alkoxide such as thallium ethoxide (I); or an inorganic thallium salt such as thallium nitrate (III), or thallium chloride (I). Among the above-described compounds, when manufacturing coating liquid using a non-polar organic solvent, from a viewpoint of solubility, the organic thallium carboxylate is preferable, and thallium 2-ethylhexanoate (I) is more preferable. Moreover, when manufacturing coating liquid using a polar organic solvent, from a viewpoint of solubility, the inorganic thallium salt is preferable, and thallium nitrate (III) is more preferable.

A contained amount of the B-containing compound in the coating liquid is appropriately selected depending on the intended purpose without any limitation.

The valence of the element Z in the oxide semiconductor is divalent, but the valence of the Z in the Z-containing compound is not limited to divalent.

For example, when Z is magnesium (II), a Mg-containing compound can be properly selected according to the purpose. For example, the Mg-containing compound includes an organic magnesium carboxylate such as magnesium 2-ethylhexanoate (II); an organomagnesium complex such as magnesium acetylacetonate (II); a magnesium alkoxide such as magnesium ethoxide (II); or an inorganic magnesium salt such as magnesium nitrate (II), or magnesium chloride (II). Among the above-described compounds, when manufacturing coating liquid using a non-polar organic solvent, from a viewpoint of solubility, the organic magnesium carboxylate is preferable, and magnesium 2-ethylhexanoate (II) is more preferable. Moreover, when manufacturing coating liquid using a polar organic solvent, from a viewpoint of solubility, the inorganic magnesium salt is preferable, and magnesium nitrate (II) is more preferable.

A contained amount of the Z-containing compound in the coating liquid is appropriately selected depending on the intended purpose without any limitation.

The coating liquid according to the embodiment is preferable as a raw material solution used for forming oxide semiconductor film having excellent conductivity. For example, the valence of Cu in the oxide semiconductor film is monovalent, but the valence of Cu in the Cu-containing compound is preferably divalent. That is, when the valence of Cu in the Cu-containing compound is divalent, one oxygen atom exists for one Cu atom. However, in a phase contributing to the p-type conductivity in Cu oxide formed by using the Cu-containing compound, because the valence of Cu is monovalent, one oxygen atom exists for two Cu atoms. That is, the coating liquid is in a state of oxygen excess in a relation between Cu and O. By using such a coating liquid, an amount of oxygen of the oxide semiconductor film that is formed is increased, and thereby carrier compensation due to oxygen defect can be suppressed. Therefore, an oxide semiconductor film exhibiting an excellent p-type conductivity by increasing the hole concentration is formed.

Moreover, in the coating liquid according to the embodiment, because the compositions of the A-containing compound, the B-containing compound, and the Z-containing compound, and a mixing ratio of the organic solvent can be adjusted widely, according to a formation method or purpose of the oxide semiconductor film that will be described later, the compositions and the mixing ratio can be adjusted properly.

<Formation Method of Oxide Semiconductor Film>

A formation method for an oxide semiconductor film according to the embodiment includes a coating step for coating a coating liquid according to the embodiment onto a support medium;

and a heat treatment process for performing a heat treatment against the support medium on which the coating liquid is coated, and further includes another step as necessary.

<<Coating Step>>

The coating step is not particularly limited as long as the step is a step for coating the coating liquid onto the support medium, and may be properly selected according to the purpose.

The support medium is not particularly limited, and may be properly selected according to the purpose. The support medium includes, for example, a glass substrate.

The coating method is not particularly limited, and may be properly selected according to the purpose. For example, an existing method such as a spin coat method, an ink-jet printing method, a slit coat method, a nozzle printing method, a gravure printing method, or a micro contact printing method, can be used. Among the above-described methods, when forming simply an oxide semiconductor film having a uniform thickness in a large area, the spin coat method or the slit coat method is preferable. Moreover, when a printing method such as the ink jet printing method or the micro contact printing method is used under an appropriated printing condition, printing in a desired shape can be performed, and patterning in a post processing is unnecessary.

<<Heat Treatment Process>>

The heat treatment process is a series of steps of performing a heat treatment against the coating liquid that is coated, and is not particularly limited as long as the coating liquid is caused to be desiccated, the A-containing compound, the B-containing compound and the Z-containing compound are caused to be decomposed, and an oxide semiconductor is caused to be generated, and can be selected properly according to the purpose.

In the heat treatment process, the desiccation of the coating liquid (in the following, referred to as a desiccation process), and decomposition of the A-containing compound, the B-containing compound and the Z-containing compound and generation of the oxide semiconductor (in the following, referred to as a decomposition and generation process) are preferably performed at different temperatures. That is, by causing the temperature to rise after desiccating the coating liquid, the A-containing compound, the B-containing compound and Z-containing compound are preferably decomposed and the oxide semiconductor is generated.

The temperature of the desiccation process is not particularly limited, but may be selected properly depending on the organic solvent included in the coating liquid. For example, the temperature is 80° C. or higher but 180° C. or lower.

Because the desiccation process is performed at low temperature, a decompression oven or the like is effectively used.

Time period of the desiccation process is not particularly limited, but may be selected properly according to the purpose. The time period is, for example, 1 minute or more but 1 hour or less.

The temperature of the decomposition and generation process is not particularly limited, but may be selected properly according to the purpose. The temperature is, for example, 200° C. or higher but 400° C. or lower.

Time period of the decomposition and generation process is not particularly limited, but may be selected properly according to the purpose. The time period is, for example, 10 minutes or more but 5 hours or less.

In addition, in the heat treatment process, the desiccation process and the decomposition and generation process may be concurrently performed, or may be divided into a plurality of processes.

A method of the heat treatment process is not particularly limited, but may be selected properly according to the purpose. For example, the method of the heat treatment process includes a method of heating the support medium on which the coating liquid is coated.

An atmosphere in the heat treatment process is appropriately selected depending on the intended purpose without any limitation. The atmosphere is preferably an air atmosphere or an oxygen atmosphere.

By performing the heat treatment process in the air atmosphere or the oxygen atmosphere for the support medium on which the coating liquid is coated, the decomposition products can be immediately ejected to the outside of the system, and oxygen defects of the oxide semiconductor can be reduced.

Upon performing the heat treatment process, irradiating the coating liquid after the desiccation process with ultraviolet light with wavelength of 400 nm or less is effective for promoting a reaction of the decomposition and generation process. By irradiating with the ultraviolet light with wavelength of 400 nm or less, chemical bonds of organic substances or the like included in the coating liquid are cut, and the organic substances are decomposed. Therefore, the oxide semiconductor can be generated efficiently.

The ultraviolet light with wavelength of 400 nm or less is not particularly limiting, but may be properly selected according to the purpose. The ultraviolet light is, for example, ultraviolet light with wavelength of 222 nm emitted from an excimer lamp.

Moreover, instead of irradiating the coating liquid after the desiccation process with ultraviolet light, or with irradiating the coating liquid after the desiccation process with ultraviolet light, ozone is preferably given to the coating liquid after the desiccation process. By giving ozone to the coating liquid after the desiccation process, generation of an oxide semiconductor is promoted.

In the method of forming an oxide semiconductor film according to the embodiment, the oxide semiconductor film is formed by a coating process. Therefore, the oxide semiconductor film can be formed easily, in large numbers, and at low cost, compared with a vacuum process.

Moreover, in the method of forming an oxide semiconductor film according to the embodiment, a p-type oxide film having excellent p-type conductivity can be formed. In the method of forming the oxide semiconductor film according to the embodiment, for the coating liquid, a Cu-containing compound including Cu, the valence of which is divalent, is preferably used. In this case, because the valence of Cu is divalent in the coating liquid, one oxygen atom exists for one Cu atom. However, in a phase contributing to the p-type conductivity of the oxide semiconductor formed by using the Cu-containing compound, because the valence of Cu is monovalent, one oxygen atom exists for two Cu atoms. That is, upon forming the oxide semiconductor film, the coating liquid is in a state of oxygen excess in a relation between Cu and O. By using such a coating liquid, an amount of oxygen of the oxide semiconductor film that is formed is increased, and thereby generation of electrons due to oxygen defects can be suppressed. Therefore, a oxide semiconductor film of an excellent p-type conductivity by increasing the hole concentration is formed.

<Semiconductor Element>

The semiconductor element according to the embodiment has an active layer including the oxide semiconductor according to the embodiment.

The active layer is not particularly limited, as long as the oxide semiconductor according to the embodiment is included, but may be properly selected according to the purpose.

As described above, because the oxide semiconductor according to the embodiment enables a characteristic according to the purpose by adjusting compositions, the oxide semiconductor is suitable for using for an active layer of the semiconductor element. That is, the active layer includes the oxide semiconductor, characteristic of which is optimized, and thereby the characteristic of the semiconductor element can be improved.

A structure, a shape and a size of the active layer are not particularly limited, but may be properly selected according to the purpose.

The semiconductor element includes, for example, a diode, or a field-effect transistor.

<Diode>

The diode is appropriately selected depending on the intended purpose without any limitation The diode includes, for example, a diode that includes a first electrode, a second electrode, and an active layer formed between the first electrode and the second electrode. Such diode includes, for example, a p-n junction diode or a PIN photo diode.

<<p-n Junction Diode>>

The p-n junction diode includes an active layer, and further includes another member, such as an anode (positive electrode) or a cathode (negative electrode) as necessary.

<<Active Layer>>

The active layer includes a p-type semiconductor layer and an n-type semiconductor layer, and further includes another member as necessary.

The p-type semiconductor layer and the n-type semiconductor layer are in contact with each other.

When forming the n-type semiconductor layer with the oxide semiconductor according to the embodiment, for example, n-type doping only has to be executed properly into $(CuO)(AlO)(ZnO)_4$ ($L=1$, $m_1=0$, $n_1=4$). On the other hand, when forming the p-type semiconductor layer with the oxide semiconductor, for example, p-type doping only has to be executed properly into $(CuO)(AlO)(MgO)_2$ ($L=1$, $m_1=0$, $n_1=2$). In this case, because p-type semiconductor layers and n-type semiconductor layers having fundamentally the same structure are stacked, a high-performance p-n junction diode with less defects on the boundary surface can be fabricated.

Moreover, because the oxide semiconductor according to the embodiment has a wide gap and transmits visible light, a transparent diode can be formed by using the oxide semiconductors.

Furthermore, either the p-type semiconductor layer or the n-type semiconductor layer can be formed with the conventional oxide semiconductor.

The method of forming the active layer is appropriately selected depending on the intended purpose without any limitation. The method includes, for example, a vacuum process such as a sputtering method, a pulse laser deposition (PLD) method, an MBE method, a CVD method, or an ALD method, or a printing method such as a dip coating method, an ink jet printing method, or a nanoimprint method. An average thickness of the active layer is appropriately selected depending on the intended purpose without any limitation. The average thickness of the active layer is preferably 50 nm or more but 2 μm or less.

<<Anode (Positive Electrode)>>

An anode is formed in contact with a p-type semiconductor layer.

A material of the anode is appropriately selected depending on the intended purpose without any limitation. The material, for example, includes a metal such as Mo, Al, Au, Ag, or Cu, an alloy thereof, a transparent conductive oxide such as indium tin oxide (ITO) or antimony-doped tin oxide (ATO), an organic conductor such as polyethylenedioxythiophene (PEDOT), or polyaniline (PANI).

A shape, a size and a structure of the anode are not particularly limited, but may be properly selected according to the purpose.

The anode is formed in contact with the p-type semiconductor layer. Between the anode and the p-type semiconductor layer, an ohmic contact is preferably formed.

A method of forming the anode is appropriately selected depending on the intended purpose without any limitation. The method includes, for example, (i) a method of forming a film by using a sputtering method or a dip coating method, and then performing patterning by using photolithography, and (ii) a method of forming a film with a desired shape directly by a printing process such as ink-jet printing, a nanoimprint, or a gravure printing.

<<Cathode (Negative Electrode)>>

A cathode is formed in contact with an n-type semiconductor layer.

A material of the cathode is appropriately selected depending on the intended purpose without any limitation. For example, the material includes materials that are the same as those described in the explanation for the anode.

A shape, a size and a structure of the cathode are not particularly limited, but may be properly selected according to the purpose.

The cathode is formed in contact with the n-type semiconductor layer. Between the cathode and the n-type semiconductor layer, an ohmic contact is preferably formed.

A method of forming the cathode is appropriately selected depending on the intended purpose without any limitation. The method includes, for example, methods that are the same as those described in the explanation for the anode.

<<Manufacturing Method for p-n Junction Diode>>

Figure 3:
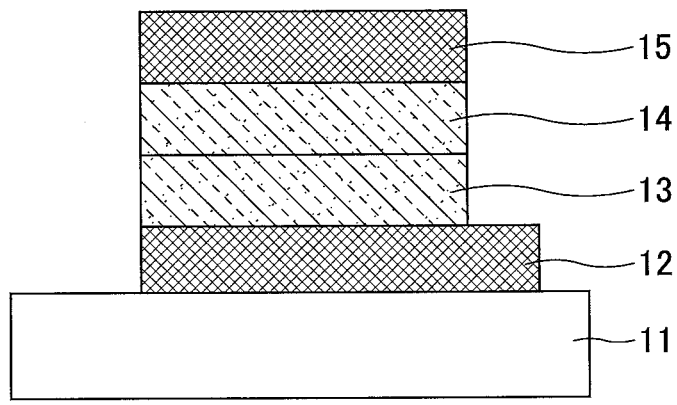
FIG. 3 is a configuration diagram schematically depicting an example of a p-n junction diode.

An example of the manufacturing method for the p-n junction diode (See FIG. 3) will be described.

First, a cathode 12 is formed on a substrate 11.

A shape, a structure and a size of the substrate 11 are appropriately selected depending on the intended purpose without any limitation.

A material of the substrate 11 is appropriately selected depending on the intended purpose without any limitation. The material includes, for example, a glass substrate, or a plastic substrate.

A material of the glass substrate is appropriately selected depending on the intended purpose without any limitation. The material includes, for example, an alkali-free glass, or a silica glass.

A material of the plastic substrate is appropriately selected depending on the intended purpose without any limitation. The material includes, for example, polycarbonate (PC), polyimide (PI), polyethylene terephthalate (PET), or polyethylene naphthalate (PEN).

In addition, the substrate 11 is preferably subjected to a preprocess such as oxygen plasma, UV ozone, UV irradiation and cleaning, regarding cleanup of the surface and enhancement of adhesiveness.

Subsequently, an n-type semiconductor layer 13 is formed on the cathode 12.

Next, a p-type semiconductor layer 14 is formed on the n-type semiconductor layer 13.

Then, the anode 15 is formed on the p-type semiconductor layer 14.

As described above, the p-n junction diode is manufactured.

<Field-effect Transistor>

A field-effect transistor includes a gate electrode, a source electrode, a drain electrode, an active layer, and a gate insulating layer. The field-effect transistor further includes another member as necessary.

<<Gate Electrode>>

The gate electrode is not particularly limited, as long as the electrode is an electrode to which a gate voltage is applied, but may be properly selected according to the purpose.

A material of the gate electrode is appropriately selected depending on the intended purpose without any limitation. The material includes a metal such as Mo, Al, Au, Ag, or Cu, an alloy thereof, transparent conductive oxide such as indium tin oxide (ITO), or antimony-doped tin oxide (ATO), organic conductor such as polyethylenedioxythiophene (PEDOT), or polyaniline (PANI).

A method of forming the gate electrode is appropriately selected depending on the intended purpose without any limitation. The method includes, for example, (i) a method of forming a film by using a sputtering method or a dip coating method, and then performing patterning by using photolithography, and (ii) a method of forming a film with a desired shape directly by a printing process such as ink-jet printing, nanoimprinting, or gravure printing.

An average thickness of the gate electrode is appropriately selected depending on the intended purpose without any limitation. The thickness is preferably 20 nm or more but 1 µm or less. The thickness is more preferably 50 nm or more but 300 nm or less.

<<Source Electrode and Drain Electrode>>

A source electrode and a drain electrode are not particularly limited, as long as the electrodes are electrodes via which electric current is extracted from the field-effect transistor, but may be properly selected according to the purpose.

Materials of the source electrode and the drain electrode are not particularly limited, but may be properly selected according to the purpose. The materials include, for example, materials that are the same as those described in the explanation for the gate electrode.

Large contact resistance between the active layer and the source electrode and between the active layer and the drain electrode lead to degradation of the transistor characteristics. In order to avoid the degradation, a material that decreases the contact resistance is preferably selected for the materials of the source electrode and the drain electrode.

A method of forming the source electrode and the drain electrode is appropriately selected depending on the intended purpose without any limitation. For example, the method includes methods that are the same as those described in the explanation for the gate electrode.

Average thicknesses of the source electrode and the drain electrode are not particularly limited, but may be properly selected according to the purpose. The thicknesses are preferably 20 nm or more but 1 µm or less, and more preferably 50 nm or more but 300 nm or less.

<<Active Layer>>

The active layer includes the oxide semiconductor according to the embodiment.

The active layer is formed between the source electrode and the drain electrode.

Here, a location "between the source electrode and the drain electrode" refers to a position where the active layer causes the field-effect transistor to function along with the source electrode and the drain electrode. The location is not particularly limited as long as the active layer is located at such a position, but may be properly selected according to the purpose.

A composition of the oxide semiconductor or a formation condition is preferably selected so as to obtain carrier concentration and carrier mobility required for functioning as the active layer.

An average thickness of the active layer is appropriately selected depending on the intended purpose without any limitation. The average thickness is preferably 3 nm or more but 1 µm or less, and more preferably 10 nm or more but 300 nm or less.

<<Gate Insulating Layer>>

A gate insulating layer is not particularly limited, as long as the insulating layer is an insulating layer formed between the gate electrode and the active layer, but may be properly selected according to the purpose.

A material of the gate insulating layer is appropriately selected depending on the intended purpose without any limitation. For example, the material includes a material that has been already widely used for mass production such as $SiO_2$, or $SiN_x$, a high-dielectric constant material such as $La_2O_3$, or $HfO_2$, or an organic material such as polyimide (PI) or fluorinated resin.

A method of forming the gate insulating layer is appropriately selected depending on the intended purpose without any limitation. For example, the method includes a vacuum film formation method such as a sputtering method, a chemical vapor deposition (CVD) method, or an atomic layer deposition (ALD) method, or a printing method such as a spin coat method, a die coating method, or an ink jet printing method.

An average thickness of the gate insulating layer is appropriately selected depending on the intended purpose without any limitation. The average thickness is preferably 10 nm or more but 1 µm or less, and more preferably 50 nm or more but 500 nm or less.

A structure of the field-effect transistor is appropriately selected depending on the intended purpose without any limitation. The structure includes, for example, a top contact/bottom gate type, a bottom contact/bottom gate type, a top contact/top gate type, and a bottom contact/top gate type (see, e.g., Japanese Unexamined Patent Application Publication No. 2010-74148).

The field-effect transistor is preferably used for a display element which will be described later. However, the present invention is not limited to this, but the field-effect transistor can be used for an IC card, an ID tag or the like.

Because the active layer includes the oxide semiconductor according the embodiment, the active layer with a preferable characteristic is enabled by adjusting compositions, and thereby the field-effect transistor exhibits an excellent transistor characteristic.

<<Manufacturing Method of Field-effect Transistor of Top Contact/Bottom Gate Type>>

Figure 4:
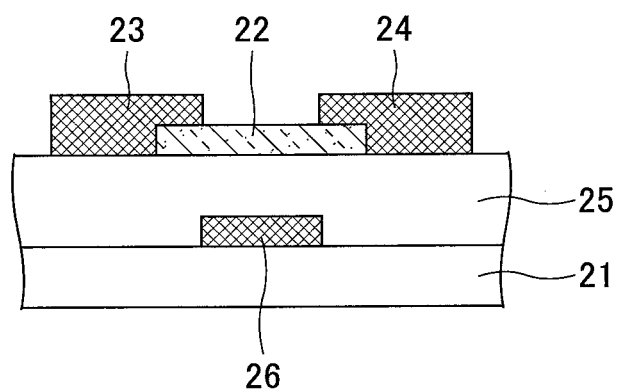
FIG. 4 is a configuration diagram schematically depicting an example of a top contact/bottom gate type field-effect transistor.

An example of a manufacturing method of the field-effect transistor of top contact/bottom gate type (See FIG. 4) will be described.

First, a gate electrode 26 is formed on a substrate 21.

A shape, a structure and a size of the substrate 21 are not particularly limited, but may be properly selected according to the purpose.

A material of the substrate 21 is appropriately selected depending on the intended purpose without any limitation. The material includes, for example, a glass substrate, or a plastic substrate.

A material of the glass substrate is appropriately selected depending on the intended purpose without any limitation. The material includes, for example, an alkali-free glass, or a silica glass.

A material of the plastic substrate is appropriately selected depending on the intended purpose without any limitation. The material includes, for example, polycarbonate (PC), polyimide (PI), polyethylene terephthalate (PET), or polyethylene naphthalate (PEN).

In addition, the substrate 21 is preferably subjected to a preprocess such as oxygen plasma, UV ozone, or UV irradiation and cleaning, regarding cleanup of the surface and enhancement of adhesiveness.

Subsequently, a gate insulating layer 25 is formed on the gate electrode 26.

Next, an active layer 22 is formed on the gate insulating layer 25 in a channel region.

Then, a source electrode 23 and a drain electrode 24 are formed separately from each other, so as to be spanned by the active layer 22 on the gate insulating layer 25.

As described above, the field-effect transistor is manufactured.

The semiconductor element according to the embodiment includes the oxide semiconductor according to the embodiment in the active layer 22. Then, a characteristic (conductivity) of the oxide semiconductor for the purpose is enabled by adjusting the compositions. Therefore, with the active layer 22 including the oxide semiconductor, the characteristic of which is optimized, the characteristic of the semiconductor element can be. improved.

The field-effect transistor according to the embodiment enables a TFT with an excellent characteristic.

<Display Element>

A display element according to the embodiment includes a light control element for controlling light output depending on a driving signal, and a driving circuit for outputting the driving signal to the light control element, and further includes another member, as necessary. <<Light Control Element>>

The light control element is not particularly limited as long as the light control element is an element for controlling light output depending on the driving signal, but may be properly selected according to the purpose. The light control element is preferably any one of an organic electroluminescence (EL) element, an electrochromic (EC) element, a liquid crystal element, an electrophoresis element and an electro-wetting element.

<<Driving Circuit>>

The driving circuit is not particularly limited, as long as the driving circuit includes the field-effect transistor according to the embodiment, but may be properly selected according to the purpose.

Because the display element according to the embodiment includes the field-effect transistor according to the embodiment, the variation of the characteristics among display elements is small.

Moreover, even when aging variation occurs in the display element, the field-effect transistor in the driving circuit can be caused to operate at a constant gate voltage. Therefore, the lifetime of the display element can be prolonged.

<Image Display Device>

An image display device according to the embodiment is provided with display elements according to the embodiment that display an image according to image data and are arranged in a matrix state; and a display control device that individually controls gate voltage and signal voltage applied to a field-effect transistor in a driving circuit according to the image data. The image display device further includes other components as necessary.

<<Display Control Device>>

The display control device is not particularly limited, as long as the display control device can individually control the gate voltage and the signal voltage of the field-effect transistor via wiring according to the image data, but may be properly selected according to the purpose.

The image display device according to the embodiment includes the display element according to the embodiment, and thereby the image display device has long service life and operates with stability.

The image display device according to the embodiment can be applied to a display unit of portable information equipment such as a mobile phone, a portable music player, a portable movie player, an electronic book, or a PDA (Personal Digital Assistant), or imaging equipment such as a digital still camera, or a video camera. Moreover, the image display device according to the embodiment also can be applied to a display unit for various types of information in a transport system such as a vehicle, an airplane, a train and a ship. Furthermore, the image display device according to the embodiment can be applied to a display unit for various types of information in a measurement apparatus, an analysis apparatus, a medical instrument, and an advertising medium.

Figure 5:
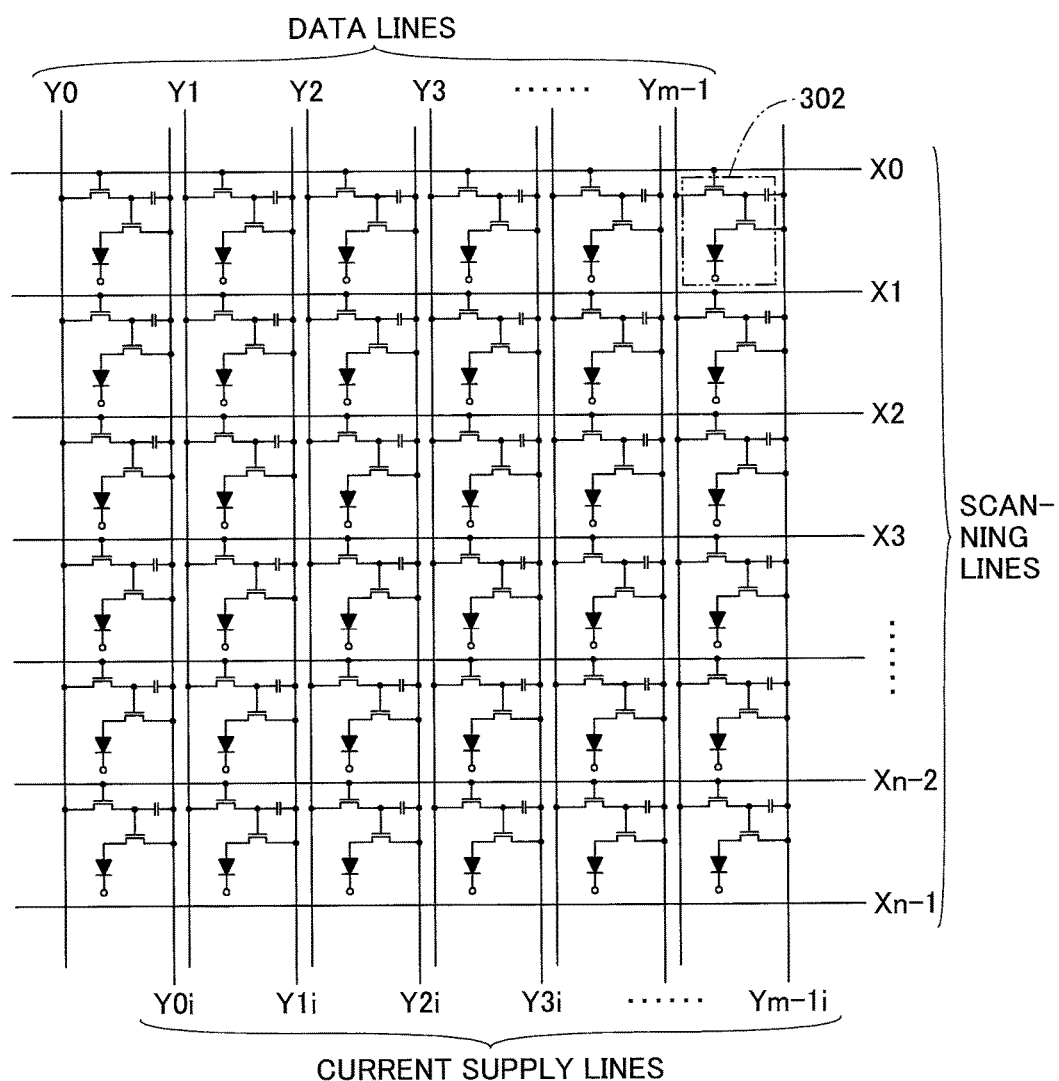
FIG. 5 is a partially enlarged view depicting an example of an image display device according to an embodiment.

FIG. 5 illustrates an organic EL display as an example of the image display device according to the embodiment.

Figure 11:
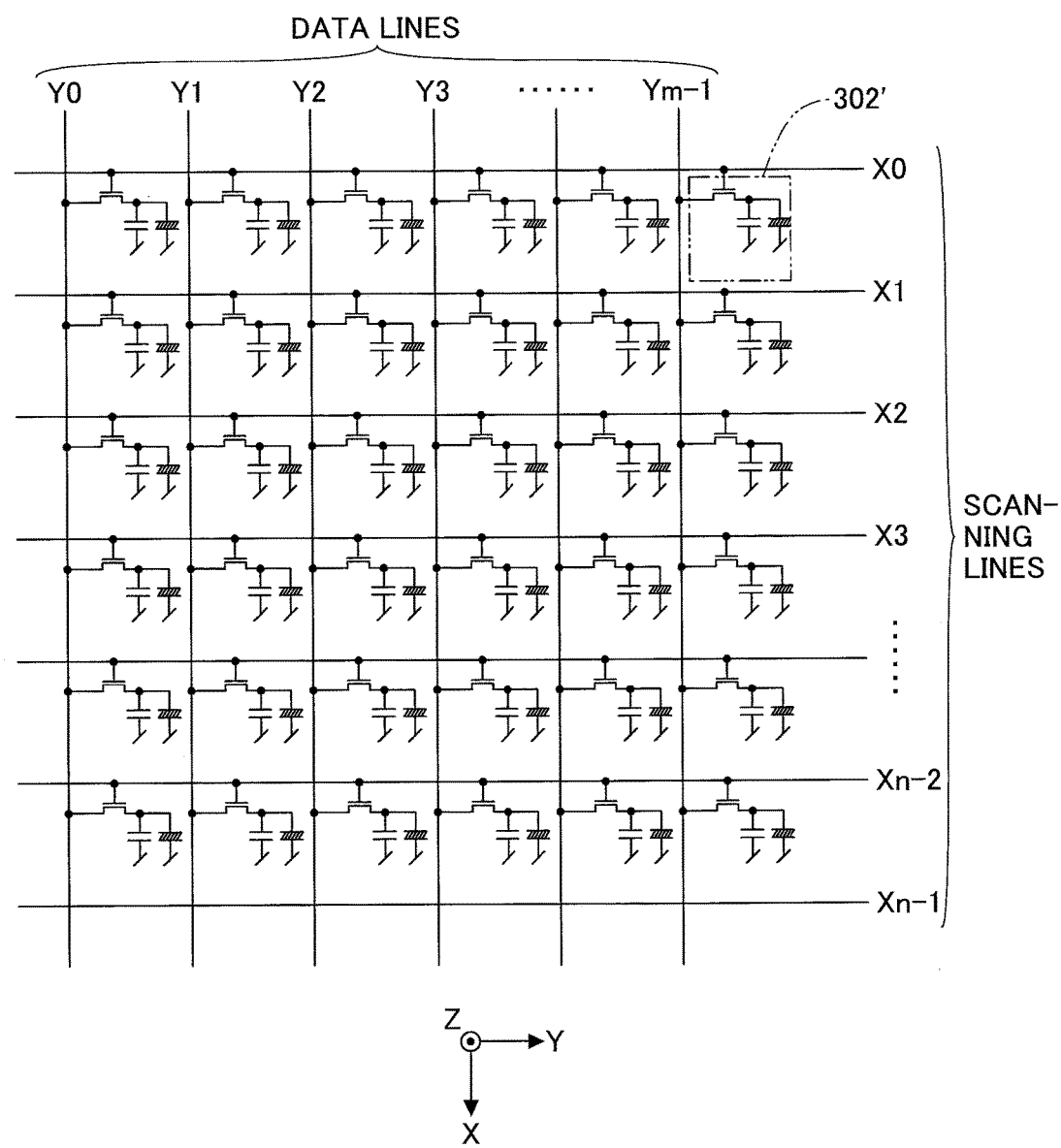
FIG. 11 is a partially enlarged view depicting another example of the image display device according to the embodiment.
Figure 12:
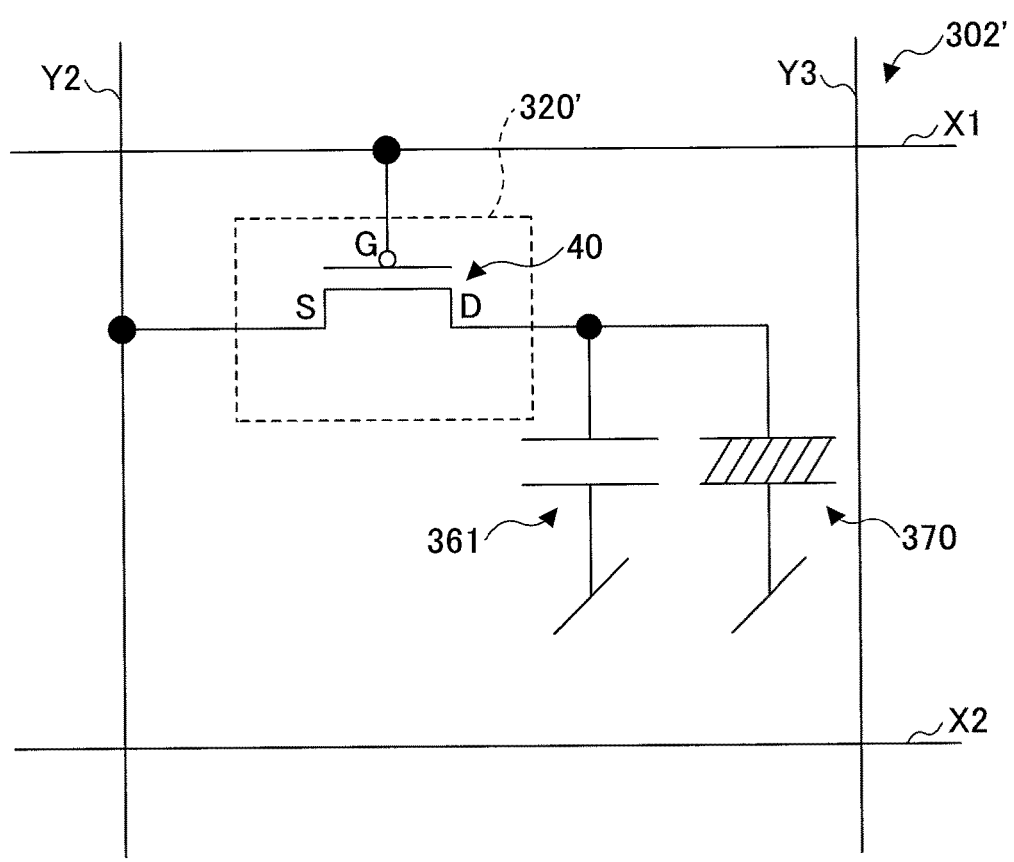
FIG. 12 is an enlarged view depicting the display element illustrated in FIG. 11.

The organic EL display includes n scanning lines arranged at regular intervals along the X-axis direction (X0, X1, X2, X3, . . . Xn−2, Xn−1), m data lines arranged at regular intervals along the Y-axis direction (Y0, Y1, Y2, Y3, . . . , Ym−1), and m current supply lines arranged at regular intervals along the Y-axis direction (Y0$i$, Y1$i$, Y2$i$, Y3$i$, . . . Ym−1$i$). In FIGS. 11 and 12, the same reference numeral (e.g. X1, Y1) has the same meaning.

Figure 6:
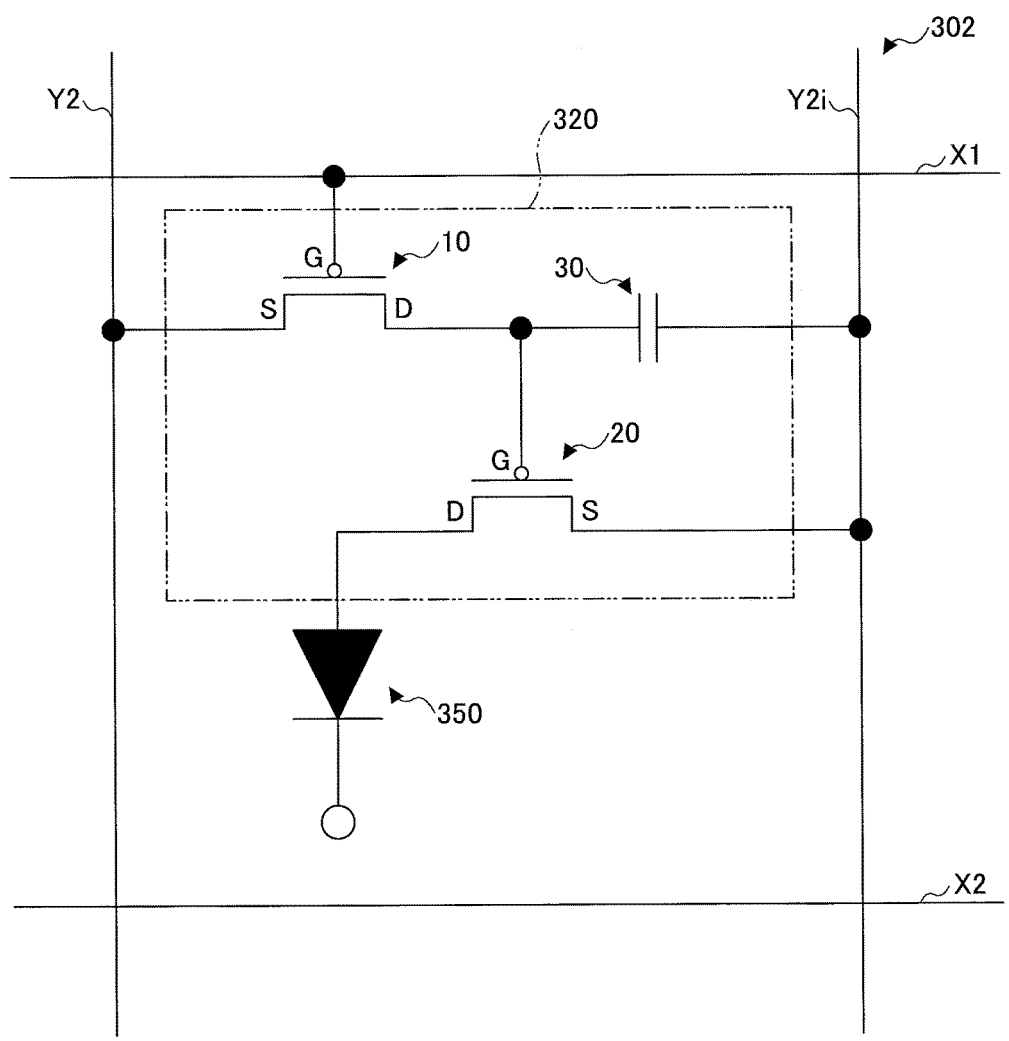
FIG. 6 is an enlarged view depicting a display element illustrated in FIG. 5.

Therefore, by the scanning line and the data line, a display element 302 (See FIG. 6) can be specified.

The display element 302 includes an organic EL (electroluminescence) element 350 and a drive circuit 320 for causing the organic EL element 350 to emit light. That is, the organic EL display is a so-called active matrix type organic EL display.

The drive circuit 320 has two field-effect transistors 10 and 20 and a capacitor 30.

The field-effect transistor 10 operates as a switching element. A gate electrode G of the field-effect transistor 10 is coupled to a predetermined scanning line. A source electrode S of the field-effect transistor 10 is coupled to a predetermined data line. Moreover, a drain electrode D of the field-effect transistor 10 is couple to one of the terminals of the capacitor 30.

The field-effect transistor 20 supplies electric current to the organic EL element 350. The gate electrode G of the field-effect transistor 20 is coupled to the drain electrode D of the field-effect transistor 10. Then, the drain electrode D of the field-effect transistor 20 is coupled to the anode of the organic EL element 350, and the source electrode S of the field-effect transistor 20 is coupled to a predetermined current supply line.

The capacitor 30 stores a state, i.e. a datum of the field-effect transistor 10. The other terminal of the capacitor 30 is coupled to the predetermined current supply line.

Then, when the field-effect transistor 10 becomes an "ON" state, a piece of image data is stored in the capacitor 30 via a signal line Y2. Even after the field-effect transistor 10 becomes an "OFF" state, the field-effect transistor 20 is retained the "ON" state corresponding to the image data, thereby the organic EL element 350 is driven.

Figure 7:
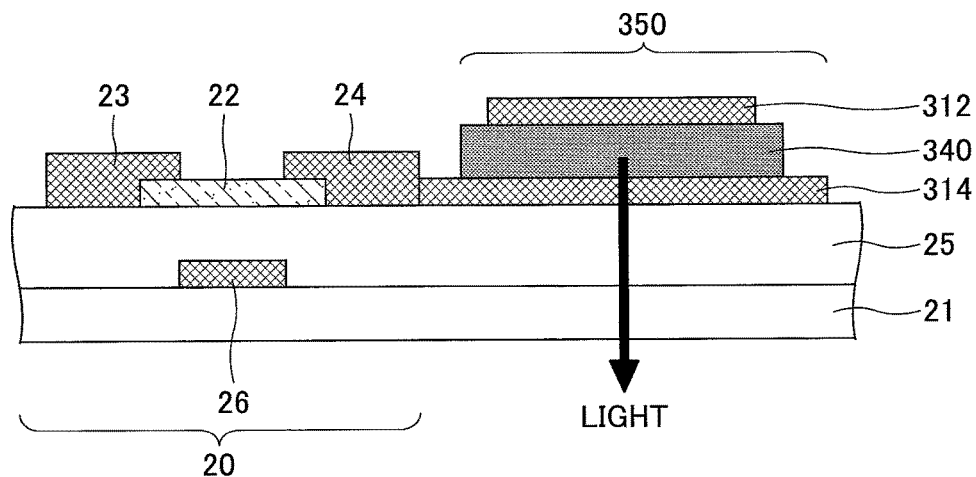
FIG. 7 is a configuration diagram schematically depicting an example of a positional relationship between an organic EL element and the field-effect transistor in the display element illustrated in FIG. 6.

FIG. 7 illustrates an example of a positional relationship between the organic EL element 350 and the field-effect transistor 20.

Here, the organic EL element 350 is arranged beside the field-effect transistor 20. In addition, the capacitor 30, which is not shown, is also formed on the substrate 21.

Then, a protection film is preferably formed on the active layer 22.

As a material of the protection film, $SiO_2$, $SiN_x$, $Al_2O_3$, a fluorine group polymer or the like is properly used.

Figure 8:
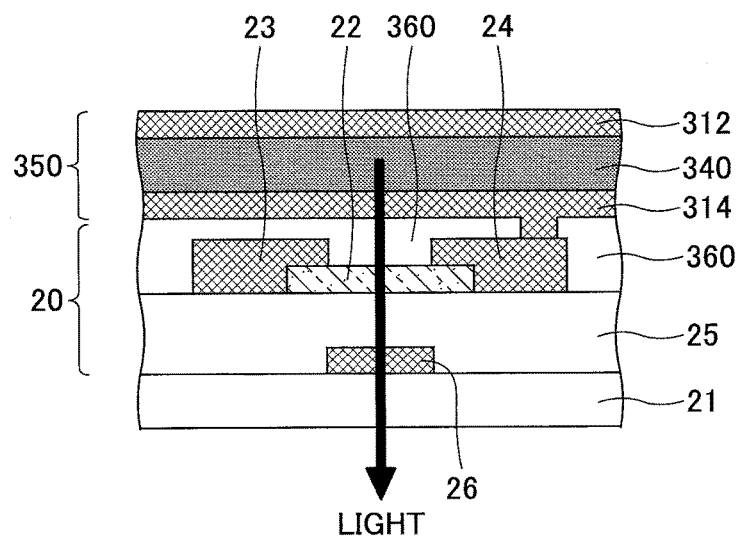
FIG. 8 is a configuration diagram schematically depicting another example of the positional relationship between the organic EL element and the field-effect transistor in the display element illustrated in FIG. 6.

FIG. 8 illustrates another example of the positional relationship between the organic EL element 350 and the field-effect transistor 20.

Here, the organic EL element 350 is arranged on the field-effect transistor 20.

In this case, because transparency is required for the gate electrode 26, a transparent oxide having conductivity, such as ITO, $In_2O_3$, $SnO_2$, ZnO, Ga-added ZnO, Al-added ZnO, or Sb-added $SnO_2$ is used for the gate electrode 26.

In addition, a reference number 360 is an interlayer insulating film (flattening film).

For a material of the interlayer insulating film, polyimide, an acrylic resin or the like can be used.

Here, in FIGS. 7 and 8, the field-effect transistor 20 includes a substrate 21, an active layer 22, a source electrode 23, a drain electrode 24, a gate insulating layer 25, and a gate electrode 26. The organic EL element 350 includes a cathode 312, an anode 314 and an organic EL thin film layer 340.

Figure 9:
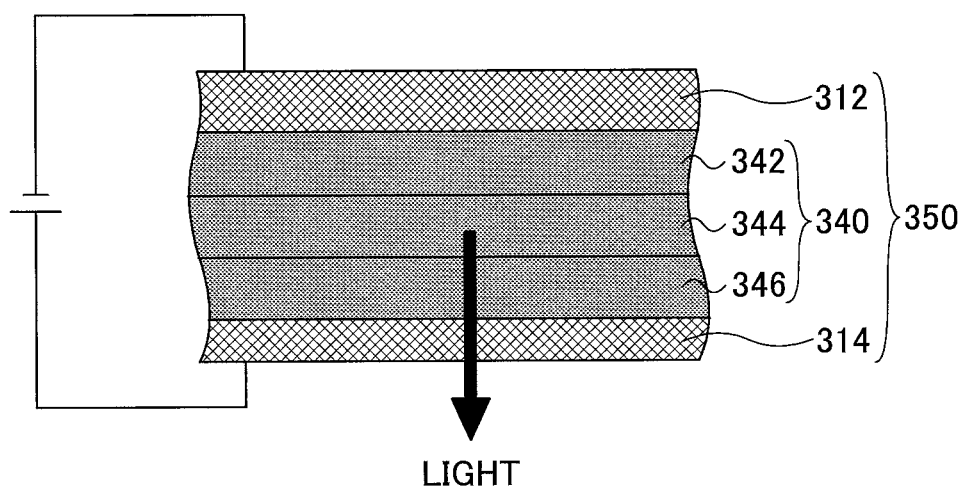
FIG. 9 is a configuration diagram schematically depicting an example of the organic EL element illustrated in FIG. 6.

FIG. 9 illustrates an example of an organic EL element.

The organic EL element 350 includes a cathode 312, an anode 314 and an organic EL thin film layer 340.

A material of the cathode 312 is appropriately selected depending on the intended purpose without any limitation. For example, the material includes aluminum (Al), alloy of magnesium (Mg) and silver (Ag), alloy of aluminum (Al) and lithium (Li), ITO (Indium Tin Oxide) or the like. The cathode 312 of the alloy of magnesium (Mg) and silver (Ag) becomes a high reflectivity electrode when the electrode is sufficiently thick. On the other hand, the electrode becomes a semi-transparent electrode when the electrode is extremely thin (less than about 20 nm). In FIG. 9, light is extracted from the anode side. However, when the cathode is transparent or semi-transparent, light can be extracted from the cathode side.

A material of the anode 314 is appropriately selected depending on the intended purpose without any limitation, and examples thereof include indium tin oxide (ITO), indium zinc oxide (IZO), and silver (Ag)-neodymium (Nd) alloy. Note that in the case where the silver alloy is used, a resulting electrode becomes a high reflectance electrode, which is suitable for taking light out from the side of the cathode.

The organic EL thin film layer 340 includes an electron transport layer 342, an emission layer 344, and a hole transport layer 346. The electron transport layer 342 is coupled to the cathode 312, and the hole transport layer 346 is coupled to the anode 314. When a predetermined electric voltage is applied between the anode 314 and the cathode 312, the emission layer 344 emits light.

Here, the electron transport layer 342 and the emission layer 344 may form a single layer. Moreover, an electron injection layer may be inserted between the electron transport layer 342 and the cathode 312. Furthermore, a hole injection layer may be inserted between the hole transport layer 346 and the anode 314.

As described above, the case of so-called "bottom emission" where light is extracted from the side of the anode 314 (lower side in FIG. 9) has been explained. However, a "top emission" where light is extracted from the side of the cathode 312 (upper side in FIG. 9) may be employed.

Figure 10:
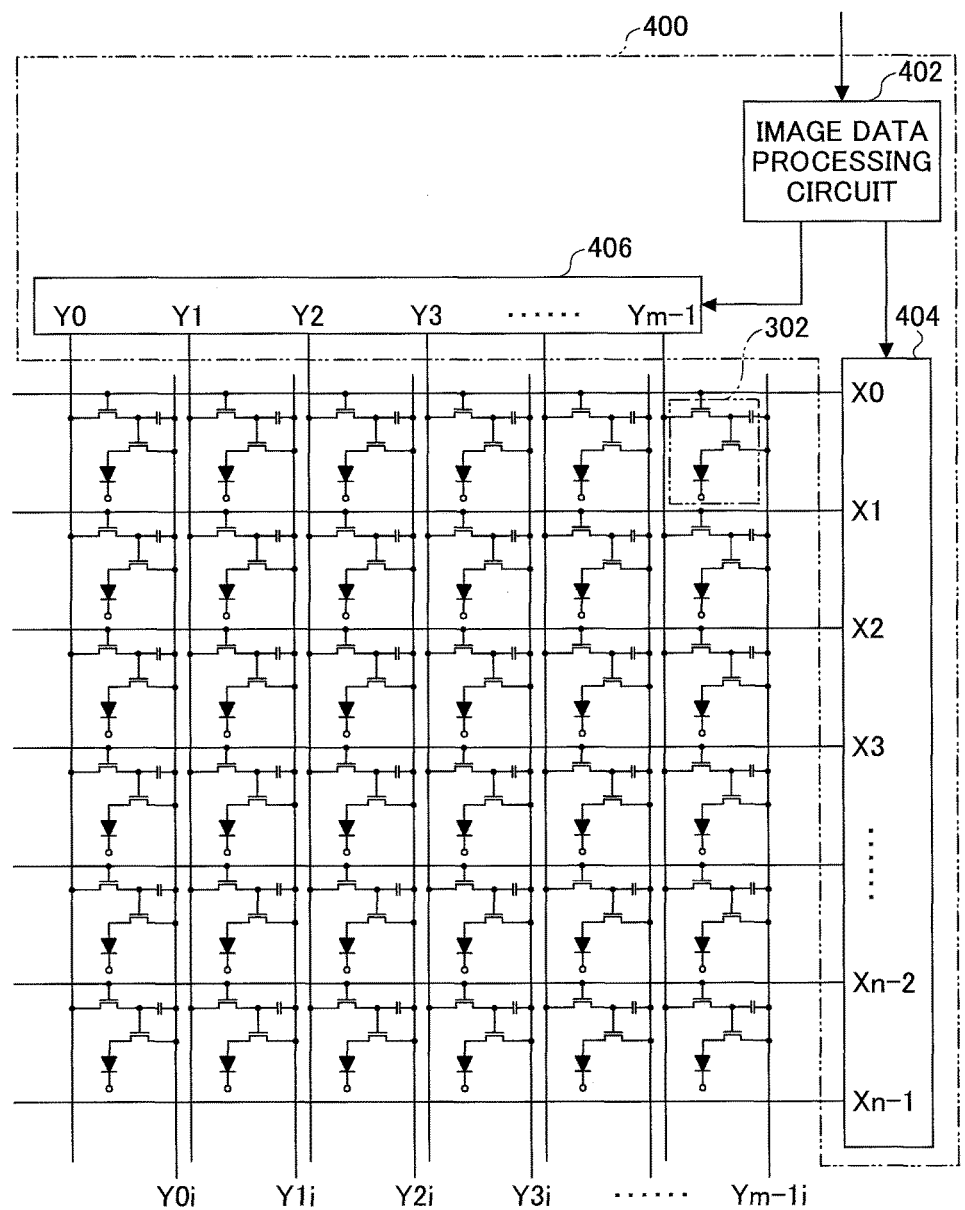
FIG. 10 is an overall view depicting the image display device illustrated in FIG. 5.

The image display device illustrated in FIG. 5 includes a display element 302, wiring (scanning lines, data lines, current supply lines), and a display control device 400, as illustrated in FIG. 10.

The display control device 400 contains an image data processing circuit 402, a scanning line driving circuit 404 and a data line driving circuit 406.

The image data processing circuit 402 determines brightness of each of the plurality of display elements 302 in the display based on an output signal from a video output circuit.

The scanning line driving circuit 404 individually applies voltage to the number "n" scanning lines in response to an instruction from the image data processing circuit 402.

The data line driving circuit 406 individually apples voltage to the number "m" data lines in response to an instruction from the image data processing circuit 402.

As described above, the case where the light control element is an organic EL element has been explained. However, the present invention is not limited to it. For example, the light control element may be an electrochromic element. In this case, the display becomes an electrochromic display.

Moreover, the light control element may be a liquid crystal element. In this case, the display is a liquid crystal display. As illustrated in FIG. 11, a current supply line for display element 302' becomes unnecessary. Moreover, as illustrated in FIG. 12, the driving circuit 320' can be composed of one field-effect transistor 40 similar to the field-effect transistors 10 and 20. In the field-effect transistor 40, the gate electrode G is coupled to a predetermined scanning line, and a source electrode S is coupled to the predetermined data line. Moreover, the drain electrode D is coupled to a capacitor 361 and a pixel electrode of a liquid crystal element 370.

Moreover, the light control element may be any one of an electrophoretic element, an inorganic EL element, and an electrowetting element.

As described above, the case where the image display device is a display has been explained. However, the present invention is not limited to it. The image display device only has to display images and information.

<Image Display System>

The image display system according to the embodiment includes the image display device according to the embodiment, and an image data preparation apparatus that prepares image data based on image information to be displayed on the image display device and outputs the image data to the image display device.

The image data preparation apparatus includes, for example, a computer (including a personal computer).

The image display device according to the embodiment includes the display element according to the embodiment, and thereby the image display device has long service life and operates with stability.

EXAMPLES

The present invention will be described with reference to the following Examples. However, it should be noted that the present invention is not limited to these Examples.

Example 1

$Cu(NO_3)_2 \cdot 3H_2O$ of 1 mmol, $Al(NO_3)_3 \cdot 9H_2O$ of 1 mmol, $Mg(NO_3)_2 \cdot 6H_2O$ of 2 mmol, ethylene glycol monomethyl ether of 3 mL, propylene glycol of 4 mL and methanol of 1 mL were mixed, to thereby obtain a coating liquid.

The coating liquid was spin-coated on a glass substrate, and after drying at 120° C. for one hour, was baked at 400° C. for three hours in an oxygen flow, and thereby a (CuO)(MgO)(AlO)(MgO) semiconductor film was formed.

Hall measurement was performed on the (CuO)(MgO)(AlO)(MgO) semiconductor film, and the semiconductor film was found to be p-type.

Example 2

$Cu(NO_3)_2 \cdot 3H_2O$ of 1 mmol, $LaCl_3 \cdot 7H_2O$ of 0.99 mmol, $Mg(NO_3)_2 \cdot 6H_2O$ of 3 mmol, $SrCl_2 \cdot 6H_2O$ of 0.01 mmol (dopant), propylene glycol monomethyl ether of 4 mL, ethylene glycol of 5 mL and isopropanol of 1 mL were mixed, to thereby obtain a coating liquid.

The coating liquid was spin-coated on a glass substrate, and after drying at 120° C. for one hour, was baked at 400° C. for three hours in an oxygen flow, and thereby a (CuO)(MgO)(LaO)(MgO)$_2$ semiconductor film was formed.

Hall measurement was performed of the (CuO)(MgO)(LaO)(MgO)$_2$ semiconductor film, and the semiconductor film was found to be p-type.

Example 3

AgNO$_3$ of 1 mmol, Y(NO$_3$)$_3$.6H$_2$O of 1 mmol, Zn(NO$_3$)$_2$.6H$_2$O of 3.98 mmol, Ga(NO$_3$)$_3$.8H$_2$O of 0.02 mmol (dopant), dimethyl form amide of 4 mL, propylene glycol of 6 mL and ethanol of 2 mL were mixed, to thereby obtain a coating liquid.

The coating liquid was spin-coated on a glass substrate, and after drying at 120° C. for one hour, was baked at 400° C. for three hours in an oxygen flow, and thereby a (AgO)(ZnO)$_2$(YO)(ZnO)$_2$ semiconductor film was formed.

Hall measurement was performed of the (AgO)(ZnO)$_2$(YO)(ZnO)$_2$ semiconductor film, and the semiconductor film was found to be n-type.

Example 4

AgNO$_3$ of 1 mmol, In(NO$_3$)$_3$.3H$_2$O of 1 mmol, Cd(NO3)$_2$.2H$_2$O of 5 mmol, ethylene glycol monomethyl ether of 5 mL, ethylene glycol of 7 mL and butanol of 2 mL were mixed, to thereby obtain a coating liquid.

The coating liquid was spin-coated on a glass substrate, and after drying at 120° C. for one hour, was baked at 400° C. for three hours in an oxygen flow, and thereby a (AgO)(CdO)$_2$(InO)(CdO)$_3$ semiconductor film was formed.

Hall measurement was performed of the (AgO)(CdO)$_2$(InO)(CdO)$_3$ semiconductor film, and the semiconductor film was found to be n-type.

TABLE 1 shows the characteristics of (AO)(ZO)$_{m1}$(BO)(ZO)$_{n1}$ semiconductor films according to Example 1 to Example 4.

TABLE 1

|  | A | Z | B | m1 | n1 | Hall measurement |
|---|---|---|---|---|---|---|
| Example 1 | Cu | Mg | Al | 1 | 1 | p-type |
| Example 2 | Cu | Mg | La | 1 | 2 | p-type |
| Example 3 | Ag | Zn | Y | 2 | 2 | n-type |
| Example 4 | Ag | Cd | In | 2 | 3 | n-type |

Comparative Example 1

Cu(NO$_3$)$_2$.3H$_2$O of 1 mmol, In(NO$_3$)$_3$.3H$_2$O of 1 mmol, ethylene glycol monomethyl ether of 1 mL, propylene glycol of 2 mL and methanol of 1 mL were mixed, to thereby obtain a coating liquid.

The coating liquid was spin-coated on a glass substrate, and after drying at 120° C. for one hour, was baked at 400° C. for three hours in an oxygen flow, and thereby a CuInO$_2$ film was formed.

Hall measurement was performed on the CuInO$_2$ film, it was not clear whether the semiconductor film was p-type or n-type.

As described above, it is shown that the (AO)(ZO)$_{m1}$(BO)(ZO)$_{n1}$ semiconductor films according to Example 1 to Example 4 can be controlled to be p-type or n-type, and the degree of freedom of material design is high.

(Fabrication of p-n Junction Diode)

<<Preparation of Substrate>>

An alkali-free glass substrate with a thickness of 0.7 mm was subjected to an ultrasonic cleaning process using neutral detergent, pure water and isopropyl alcohol. After desiccation, a UV-ozone process was performed at 90° C. for 10 minutes, and thereby a substrate was obtained.

<<Formation of Cathode>>

On the glass substrate, Al was evaporated for 100 nm via a metal mask, to form a cathode.

<<Formation of N-type Semiconductor Layer>>

On the cathode, in the same way as in Example 3, the (AgO)(ZnO)$_2$(YO)(ZnO)$_2$ semiconductor film (n-type semiconductor layer) with a thickness of 30 nm was formed.

<<Formation of P-type Semiconductor Layer>>

On the n-type semiconductor layer, in the same way as in Example 2, the (CuO)(MgO)(LaO)(MgO)$_2$ semiconductor film (p-type semiconductor layer) with a thickness of 25 nm was formed.

<<Formation of Anode>>

On the p-type semiconductor layer, Au was evaporated for 100 nm via a metal mask, to form an anode, and thereby a p-n junction diode was obtained.

An I-V characteristic of the p-n junction diode was measured.

Figure 13:
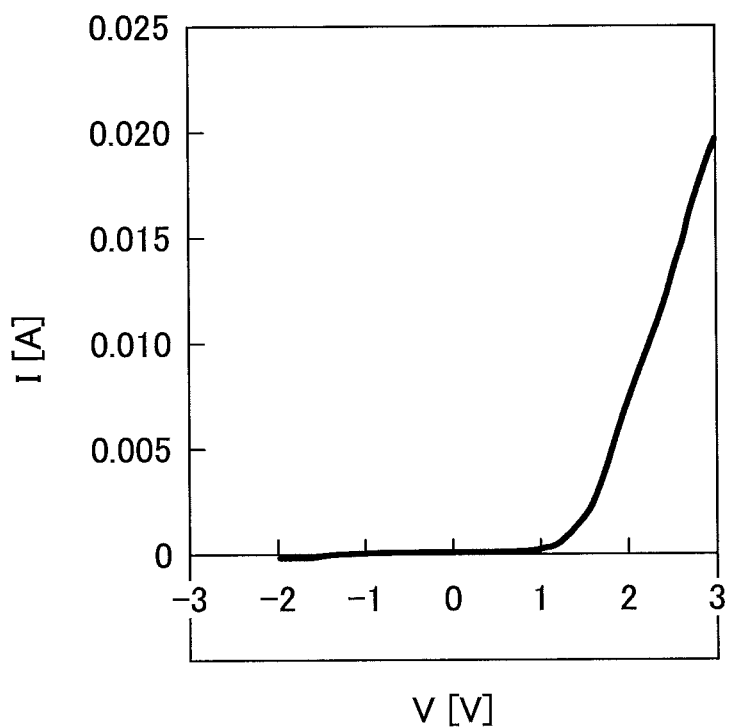
FIG. 13 is a diagram depicting an I-V characteristic of a p-n junction diode according to an example.

FIG. 13 shows the I-V characteristic of the p-n junction diode.

FIG. 13 exhibits a typical rectifying property of the p-n junction diode.

As described above, a p-n junction diode was found to be enabled by using the (CuO)(MgO)(LaO)(MgO)$_2$ semiconductor film according to Example 2 and the (AgO)(ZnO)$_2$(YO)(ZnO)$_2$ semiconductor film according to Example 3 for an active layer.

(Fabrication of Field-effect Transistor)

<<Preparation of Substrate (Gate Electrode on Which Gate Insulating Layer is Formed)>>

A Si substrate with a thermally oxidized film with a thickness of 200 nm was subjected to an ultrasonic cleaning process using neutral detergent, pure water and isopropyl alcohol. After desiccation, a UV-ozone process was performed at 90° C. for 10 minutes, and thereby the substrate was obtained. Here, the thermally oxidized film is a gate insulating layer, and the Si substrate is a gate electrode.

<<Formation of Active Layer>>

On the gate insulating layer, in the same way as in Example 1, a (CuO)(MgO)(AlO)(MgO) semiconductor film (p-type semiconductor layer) with a thickness of 20 nm was formed. Afterwards, by photolithography the active layer was formed.

<<Formation of Source Electrode and Drain Electrode>>

After Cr was evaporated for 1 nm on the active layer via a metal mask, Au was evaporated for 100 nm, to form a source electrode and a drain electrode. At this time, a channel length was set to 50 μm and a channel width was set to 400 μm.

Finally, in an oxygen flow, an annealing process was performed at 300° C. for one hour, and thereby a field-effect transistor was obtained.

A transfer characteristic ($V_{ds}$=−20 V) of the field-effect transistor was measured, and normally off and excellent p-type characteristic was exhibited.

(Fabrication of Field-effect Transistor)

<<Preparation of Substrate (Gate Electrode on Which Gate Insulating Layer is Formed)>>

A Si substrate with a thermally oxidized film with a thickness of 200 nm was subjected to an ultrasonic cleaning process using neutral detergent, pure water and isopropyl alcohol. After desiccation, a UV-ozone process was performed at 90° C. for 10 minutes, and thereby a substrate was obtained. Here, the thermally oxidized film is a gate insulating layer, and the Si substrate is a gate electrode.

<<Formation of Active Layer>>

On the gate insulating layer, in the same way as in Example 4, a $(AgO)(CdO)_2(InO)(CdO)_3$ semiconductor film (n-type semiconductor layer) with a thickness of 20 nm was formed. Afterwards, by photolithography an active layer was formed.

<<Formation of Source Electrode and Drain Electrode>>

Al was evaporated for 100 nm on the active layer via a metal mask, to form a source electrode and a drain electrode. At this time, a channel length was set to 50 μm and a channel width was set to 400 μm.

Finally, in an oxygen flow, an annealing process was performed at 300° C. for one hour, and thereby a field-effect transistor was obtained.

A transfer characteristic ($V_{ds}$=−20 V) of the field-effect transistor was measured, normally off and excellent n-type characteristic was exhibited.

Further, the present invention is not limited to these examples, but various variations and modifications may be made without deviating from the scope of the present invention.

What is claimed is:

1. An oxide semiconductor comprising an oxide having a layered structure expressed by an expression $$\prod_{i=1}^{L}[(AO)(ZO)_{m_i}(BO)(ZO)_{n_i}]_i$$

wherein an atom A is a positive monovalent element, an atom Z is a positive divalent element, an atom B is a positive trivalent element, L is a positive integer, and $m_i$ and $n_i$ are independent integers greater than or equal to zero, that satisfy $$\sum_{i}^{L}(m_i+n_i) \neq 0.$$

2. The oxide semiconductor according to claim 1, wherein the atom A includes any of Cu, Ag, Au, Pt and Pd.

3. The oxide semiconductor according to claim 1, wherein the atom Z includes any of Be, Mg, Ca, Sr, Ba, Zn and Cd.

4. The oxide semiconductor according to claim 1, wherein the atom B includes any of Al, Ga, In, Tl, Sc, Y, Ln, Cr, Mn, Fe, Co, Ni, and Rh.

5. A coating liquid used for forming a film of the oxide semiconductor according to claim 1, comprising:
a compound including the atom A or the same element as the atom A with different valence from a valence of the atom A;
a compound including the atom B or the same element as the atom B with different valence from a valence of the atom B;
a compound including the atom Z or the same element as the atom Z with different valence from a valence of the atom Z; and
an organic solvent.

6. The coating liquid according to claim 5,
wherein the compound including the atom A or the same element as the atom A with different valence from the valence of the atom A, the compound including the atom B or the same element as the atom B with different valence from the valence of the atom B, and the compound including the atom Z or the same element as the atom Z with different valence from the valence of the atom Z are independent and are respectively at least any of an inorganic salt, an oxide, a hydroxide, an organic acid salt, a metal alkoxide, an organometallic compound, and a metal complex.

7. The coating liquid according to claim 5,
wherein the organic solvent includes at least any of organic acid, organic acid ester, aromatic series, diol, glycol ether, and an aprotic polarity solvent.

8. A method of forming an oxide semiconductor film, comprising:
a process of coating a support medium with the coating liquid according to claim 5; and
a process of performing a heat treatment process on the support medium on which the coating liquid is coated, to generate the semiconductor oxide on the support medium.

9. A semiconductor element comprising:
an active layer including the oxide semiconductor according to claim 1.

10. The semiconductor element according to claim 9, further comprising:
a diode including a first electrode and a second electrode,
wherein the active layer is formed between the first electrode and the second electrode.

11. The semiconductor element according to claim 9, further comprising:
a field-effect transistor including a gate electrode, a source electrode and a drain electrode,
wherein the active layer is formed between the source electrode and the drain electrode, and
wherein a gate insulating layer is further formed between the gate electrode and the active layer.

12. A display element comprising:
a light control element configured to control light output in response to a driving signal; and
a driving circuit configured to output the driving signal to the light control element,
wherein the driving circuit includes the semiconductor element according to claim 11.

13. The display element according to claim 12,
wherein the light control element is any of an organic electroluminescence element, an electrochromic element, a liquid crystal element, an electrophoresis element and an electro-wetting element.

14. An image display device for displaying an image depending on image data, comprising:
the display element according to claim 12 arranged in a matrix state; and
a display control device configured to individually control a gate voltage and a signal voltage to be applied to the semiconductor element depending on the image data.

15. An image display system comprising:
the image display device according to claim 14; and
an image data preparation apparatus configured to prepare the image data based on image information for displaying on the image display device, and to output the image data to the image display device.

* * * * *